US010497761B2

(12) United States Patent
Okazaki

(10) Patent No.: US 10,497,761 B2
(45) Date of Patent: Dec. 3, 2019

(54) DISPLAY DEVICE HAVING A PROJECTION PROVIDED ON THE INORGANIC FILM

(71) Applicant: Sharp Kabushiki Kaisha, Sakai, Osaka (JP)

(72) Inventor: Shoji Okazaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/278,904

(22) Filed: Feb. 19, 2019

(65) Prior Publication Data

US 2019/0252472 A1  Aug. 15, 2019

Related U.S. Application Data

(63) Continuation of application No. 16/019,675, filed on Jun. 27, 2018, now Pat. No. 10,249,690, which is a continuation of application No. 15/560,506, filed as application No. PCT/JP2016/058694 on Mar. 18, 2016, now Pat. No. 10,050,090.

(30) Foreign Application Priority Data

Mar. 25, 2015  (JP) .................................. 2015-063230

(51) Int. Cl.
| | |
|---|---|
| H01L 27/32 | (2006.01) |
| H05B 33/02 | (2006.01) |
| H05B 33/06 | (2006.01) |
| H05B 33/22 | (2006.01) |
| H01L 51/00 | (2006.01) |

(52) U.S. Cl.
CPC ...... *H01L 27/3223* (2013.01); *H01L 27/3244* (2013.01); *H01L 51/0097* (2013.01); *H05B 33/02* (2013.01); *H05B 33/06* (2013.01); *H05B 33/22* (2013.01); *H01L 2227/326* (2013.01); *H01L 2251/5338* (2013.01); *Y02E 10/549* (2013.01)

(58) Field of Classification Search
CPC . H01L 27/32; H01L 27/3223; H01L 27/3244; H01L 51/0097; H01L 2251/5338
See application file for complete search history.

(56) References Cited

U.S. PATENT DOCUMENTS

2006/0284232 A1* 12/2006 Hong ................ H01L 27/10894
257/306

OTHER PUBLICATIONS

Okazaki, "Display Device Having a Supression", U.S. Appl. No. 16/019,675, filed Jun. 27, 2018.

* cited by examiner

*Primary Examiner* — Hoai V Pham
(74) *Attorney, Agent, or Firm* — Keating & Bennett, LLP

(57) ABSTRACT

An organic EL display device provided with a display portion includes a flexible base material (substrate) in which the display portion is provided, an inorganic film provided on the base material, a display element portion that is provided on the inorganic film and is provided to form the display portion, and a suppression portion that is provided outside the display portion and suppresses progression of cracking that has occurred in a peripheral portion of the base material.

20 Claims, 11 Drawing Sheets

DISPLAY DEVICE HAVING A PROJECTION PROVIDED ON THE INORGANIC FILM

TECHNICAL FIELD

The present invention relates to a display device including a display portion, in particular, a flexible display device configured to be bendable.

BACKGROUND ART

In recent years, for example, an organic EL (electroluminescence) display device including an organic EL element and a liquid crystal display device have been widely used for a television receiver, a monitor, a mobile phone, or a tablet as a flat panel display with features such as a smaller thickness and a lighter weight as compared with the conventional cathode ray tubes.

The above-described display device is provided with a display portion that displays information such as characters and images.

Furthermore, as the above-described display device, a flexible display device configured to be bendable has been developed and put into practical use, enabling information display to be performed by a display portion in a bent state. That is, a display device including such a display portion includes a flexible substrate, and a display element portion that is provided on the substrate and is provided to form the display portion. This display device is configured to allow the substrate to be bent in a state in which an organic EL layer or a liquid crystal layer, or a switching element such as a thin film transistor that are included in the display element portion are placed on the substrate.

In the above-described conventional display device, a TFT layer provided with the above-described display element portion such as a thin film transistor is bonded to a flexible substrate, with two layers, namely, a commonly used adhesive material layer and an adhesive material layer including glass fibers interposed therebetween, as described in Patent Document 1 below, for example. Then, this conventional display device is intended to reduce the bending stress and the stress due to thermal expansion that act on the TFT layer, thus achieving high reliability.

PRIOR ART DOCUMENT

Patent Document

[Patent Document 1] JP 2011-27822A

DISCLOSURE OF INVENTION

Problem to be Solved by the Invention

However, the above-described conventional display device may be problematic in that adverse effects of cracking that has occurred in a peripheral portion of the substrate cannot be obviated.

Specifically, in the conventional display device, the inorganic film is generally provided inside the above-described TFT layer. Accordingly, stress concentration or the like may occasionally occur in the inorganic film inside the TFT layer during a manufacturing step or during use of the display device. When such stress concentration or the like occurs, cracking may occur from a peripheral portion of the substrate in the conventional display device. This cracking may expand to the inside of the substrate to cause defects in the display element portion, and hence the display portion.

In view of the above-described problem, it is an object of the present invention to provide a highly reliable display device capable of obviating adverse effects of cracking.

Means for Solving Problem

In order to attain the above-described object, a display device according to the present invention including a display portion, the display device including;

a flexible substrate in which the display portion is provided;

an inorganic film provided on the substrate;

a display element portion that is provided on the inorganic film and is provided to form the display portion; and a suppression portion that is provided outside the display portion and suppresses progression of cracking that has occurred in a peripheral portion of the substrate.

In the display device configured as above, the suppression portion is provided outside the display portion, and suppresses the progression of cracking that has occurred in a peripheral portion of the substrate. Consequently, unlike the conventional example, even when cracking has occurred in a peripheral portion of the substrate, it is possible to prevent the cracking from progressing to the inside of the display portion. As a result, unlike the above-described conventional example, it is possible to form a highly reliable display device capable of obviating adverse effects of cracking.

The above-described display device may include a terminal portion that is provided on the inorganic film and connects the display element portion to a signal line from outside, wherein a suppression member included in the suppression portion is provided inside the terminal portion.

In this case, the suppression member is provided inside the terminal portion. Accordingly, even when cracking has occurred in a peripheral portion of the substrate, it is possible to reliably prevent the cracking from progressing to the inside of the terminal portion, and hence the inside of the display portion.

In the above-described display device, it is preferable that the suppression member included in the suppression portion is formed of the same material as that of a terminal included in the terminal portion.

In this case, the suppression member and the terminal can be formed in the same manufacturing step, making it possible to easily manufacture a highly reliable display device capable of obviating adverse effects of cracking.

In the above-described display device, it is preferable that a suppression member included in the suppression portion is formed of the same material as a metal material included in the display element portion.

In this case, the suppression member and the metal material can be formed in the same manufacturing step, making it possible to easily manufacture a highly reliable display device capable of obviating adverse effects of cracking.

In the above-described display device, it is preferable that a suppression member included in the suppression portion is formed of the same material as a semiconductor material included in the display element portion.

In this case, the suppression member and the semiconductor material can be formed in the same manufacturing step, making it possible to easily manufacture a highly reliable display device capable of obviating adverse effects of cracking.

In the above-described display device, the suppression portion may include a plurality of suppression members arranged along one direction, and end portions of the plurality of suppression members may be provided so as to overlap each other in a direction orthogonal to the one direction.

In this case, the effect of suppressing the progression of cracking by the suppression portion can be easily enhanced, making it possible to reliably obviate adverse effects of cracking.

In the above-described display device, it is preferable that a suppression member included in the suppression portion is disposed at a center of bending of the substrate.

In this case, the suppression member is placed at a location where cracking tends to occur. Accordingly, the progression of cracking can be more effectively suppressed, making it possible to more reliably obviate adverse effects of cracking.

In the above-described display device, a suppression member included in the suppression portion may be provided with a cut-out portion at a position corresponding to a center of bending of the substrate.

In this case, even when the substrate is bent, a damage to the suppression member can be suppressed by the cut-out portion, making it possible to easily inhibit the occurrence of a damage or the like to the suppression member.

In the above-described display device, the suppression portion may include a plurality of suppression members that are stacked on each other.

In this case, the strength of the suppression member can be increased, making it possible to reliably inhibit the occurrence of a damage or the like to the suppression member.

In the above-described display device, it is preferable that, of the plurality of suppression members, a suppression member located on a bending side of the substrate has a width dimension having a value smaller than that of a width dimension of a suppression member located on a side opposite to the bending side of the substrate.

In this case, the strength of the suppression members against bending of the substrate can be increased, making it possible to reliably inhibit the occurrence of a damage or the like to the suppression members.

Effects of the Invention

According to the present invention, it is possible to provide a highly reliable display device capable of obviating adverse effects of cracking.

DESCRIPTION OF THE INVENTION

Figure 1:
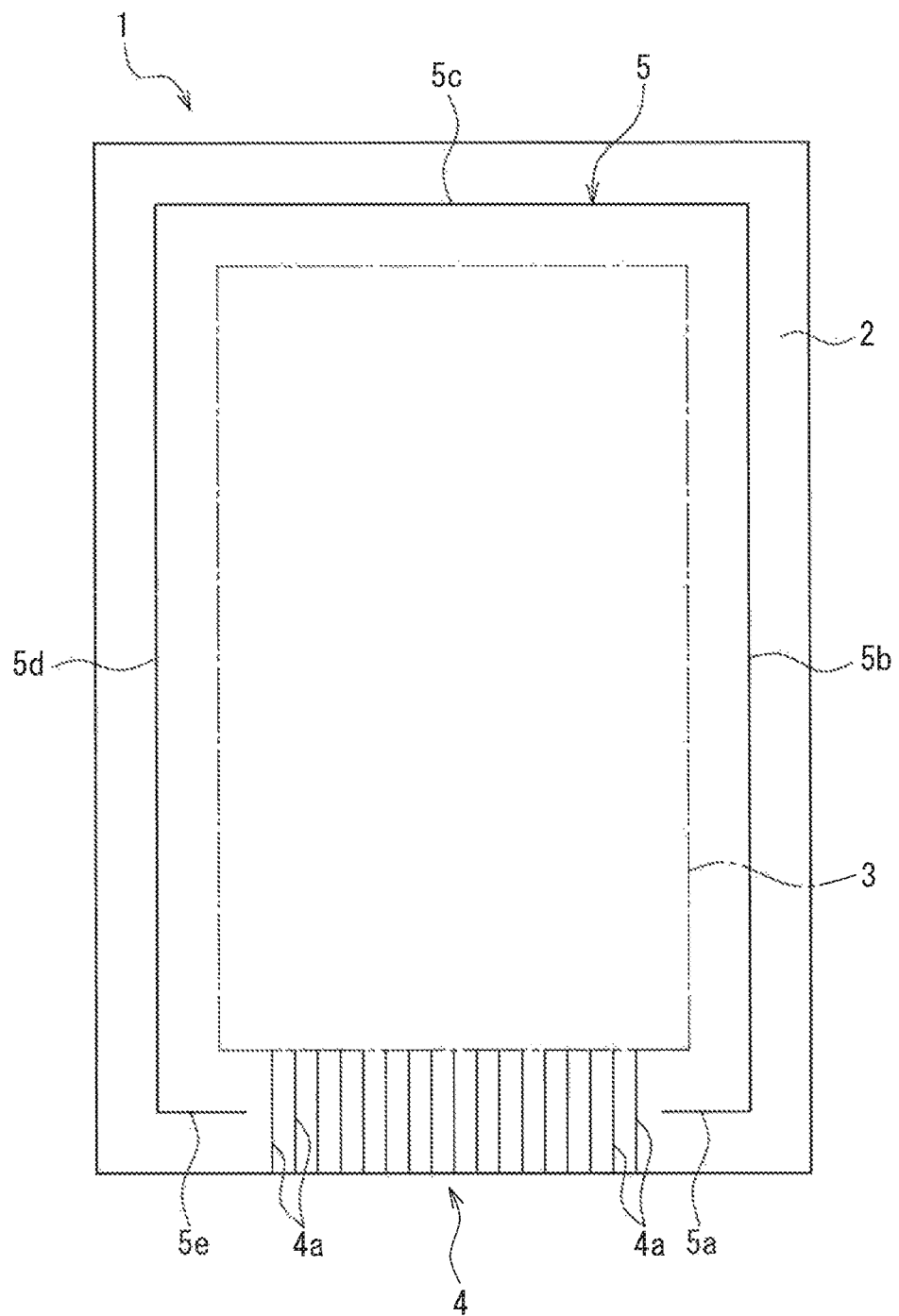
FIG. 1 is a plan view showing an organic EL display device according to Embodiment 1 of the present invention.

Hereinafter, preferred embodiments of a display device according to the present invention will be described with reference to the drawings. In the following description, the present invention is applied to an organic EL display device as an example. The dimensions of the constituent members in the drawings are not faithful representation of the dimensions of actual constituent members, dimensional ratios of those members, and the like.

Embodiment 1

FIG. 1 is a plan view showing an organic EL display device according to Embodiment 1 of the present invention. In FIG. 1, the organic EL display device 1 of the present embodiment includes a base material 2 as a substrate, and a display portion 3 that displays information such as characters and images. As will be described in detail later, the organic EL display device 1 of the present embodiment is provided with an inorganic film provided on the base material 2, a display element portion that is provided on the inorganic film and is used to configure the display portion 3, and a terminal portion 4 that is provided on the inorganic film and connects the display element portion and an external signal line.

The display portion 3 is provided with organic EL (electroluminescence) elements included in the above-described display element portion. The organic EL elements constitute a rectangular pixel area. In the pixel area, a plurality of pixels (plurality of sub-pixels) are disposed in a matrix configuration, and the organic EL element emits light for each sub-pixel so as to perform information display. The organic EL display device 1 of the present embodiment can perform color display by forming sub-pixels of red (R), green (G), and blue (B) by the organic EL elements.

As shown in FIG. 1, a plurality of terminals 4a provided parallel to each other are included in the terminal portion 4. Each of the terminals 4a is configured to be connected to a signal line from outside.

Furthermore, the organic EL display device 1 of the present embodiment is provided with a suppression portion 5 that is provided outside the display portion 3 and suppresses the progression of cracking that has occurred in a peripheral portion of the base material 2. Specifically, as shown in FIG. 1, the suppression portion 5 includes five suppression members 5a, 5b, 5c, 5d, and 5e that are provided so as to surround the display portion 3. That is, in the suppression portion 5, the suppression members 5a, 5c, and 5e are provided parallel to a short side of the rectangular display portion 3, and the suppression members 5b and 5d are provided parallel to a longer side of the rectangular display portion 3. The suppression members 5a, 5c, and 5e are continuously formed in this order.

In the suppression portion 5, the suppression members 5a, 5b, 5c, 5d, and 5e are formed of the same material and in the same manufacturing step as a part of the above-described display element portion (the details of which will be described later).

In the above description, each of the suppression members 5a to 5e is formed by a single line in the suppression portion 5. However, the present embodiment is not limited thereto. Suppression members that are parallel to the corresponding suppression members 5a to 5e may be provided inside and/or outside the suppression members 5a to 5e. Alternatively, suppression members that are stacked on the corresponding suppression members 5a to 5e in the thickness direction of the base material 2 may be provided as in an embodiment described later.

Next, the configuration of a relevant portion of the organic EL display device 1 according to the present embodiment will be described with reference to FIGS. 2 to 4.

Figure 2:
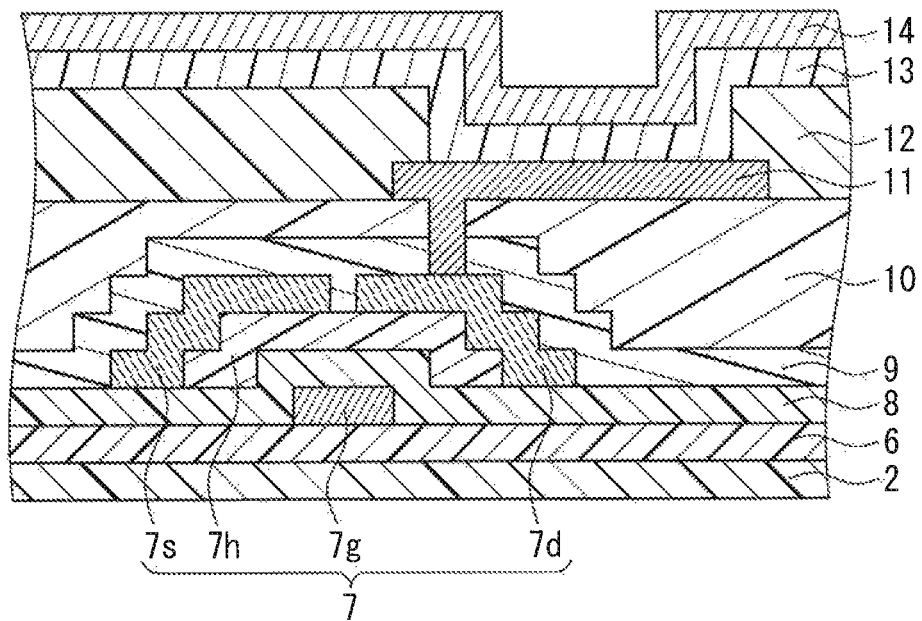
FIG. 2 is an enlarged cross-sectional view illustrating a pixel configuration of the organic EL display device.

FIG. 2 is an enlarged cross-sectional view illustrating a pixel configuration of the above-described organic EL display device. FIG. 3 is an enlarged cross-sectional view illustrating a specific example of the suppression member shown in FIG. 1. FIGS. 4(a) to 4(e) are enlarged cross-sectional views each illustrating another specific example of the suppression members shown in FIG. 1.

As shown in FIG. 2, in the organic EL display device 1 of the present embodiment, each of the above-described pixels (sub-pixels) is provided with a thin film transistor (TFT) 7 serving as a switching element that controls the light emission of the corresponding sub-pixel.

Specifically, the inorganic film 6 is provided on the base material 2. The base material 2 is formed of a flexible (bendable) synthetic resin, for example, polyimide so as to configure the organic EL display device 1 to be bendable. The inorganic film 6 is formed of, for example, an inorganic material such as silicon nitride ($SiN_x$), silicon oxide ($SiO_x$), or silicon oxynitride (SiON). The inorganic film 6 has the function of a moistureproof layer, and is configured to prevent the degradation of the thin film transistor 7 included in the display element portion and the organic EL element due to permeation (penetration) of moisture or oxygen from the outside.

A gate electrode 7g of the thin film transistor 7 and a gate line (not shown) connected to the gate electrode 7g are provided on the inorganic film 6. The gate electrode 7g and the gate line (scanning line) are formed of, for example, a molybdenum film, an aluminum film, a titanium film, a tungsten film, a tantalum film, a silver film, a copper film, or an alloy film thereof, or a transparent electrode material such as ITO or IZO. The gate electrode 7g and the gate line are configured to be formed simultaneously in the same step, for example.

A gate insulating film 8 is formed so as to cover the gate electrode 7g and the gate line. The gate insulating film 8 is formed of, for example, an inorganic material such as silicon nitride ($SiN_x$), silicon oxide ($SiO_x$), or silicon oxynitride (SiON).

A semiconductor layer 7h of the thin film transistor 7 is provided on the gate insulating film 8. The semiconductor layer 7h is formed of, for example, amorphous silicon, polysilicon, microcrystalline silicon, or an oxide semiconductor. Furthermore, as the oxide semiconductor, an In—Ga—Zn—O-based amorphous oxide semiconductor containing In, Ga, and Zn at a ratio of 1:1:1 is preferably used.

A source electrode 7s and a drain electrode 7d of the thin film transistor 7, and a source line (not shown) connected to the source electrode 7s are provided on the gate insulating film 8. The source electrode 7s, the drain electrode 7d, and the source line (data line) are formed of, for example, a molybdenum film, an aluminum film, a titanium film, a tungsten film, a tantalum film, a silver film, a copper film, or an alloy film thereof or a transparent electrode material such as ITO or IZO. The source electrode 7s, the drain electrode 7d, and the source line are configured to be formed simultaneously in the same step, for example.

A plurality of the gate lines and a plurality of the source lines are provided, and are installed in a matrix configuration on the base material 2. The gate lines and the source lines are included in the above-described display element portion, together with the thin film transistor 7 and the organic EL element. Then, in the organic EL display device of the present embodiment, the thin film transistors 7 are placed at intersection portions of the gate lines and the source lines, and the sub-pixel area is defined by the gate lines and the source lines. Further, a gate driver and a source driver are connected (not shown) to the gate lines and the source lines, respectively, via the terminals 4a of the terminal portion 4. Thus, the thin film transistors 7 being in one-to-one correspondence with the sub-pixels are driven in accordance with an image signal input from the signal lines from outside.

A protective film 9 is provided so as to cover the source electrode 7s, the semiconductor layer 7h, the drain electrode 7d, and the source line. The protective film 9 is formed of for example, an inorganic material such as silicon nitride ($SiN_x$) or silicon oxide ($SiO_x$).

A planarization layer 10 is provided on the protective film 9. The planarization layer 10 is formed of, for example, an organic silicon (organosilicon) such as polysiloxane or silicon carbide oxide, or an organic material such as acrylate, polyurea, parylene, polyimide, or polyamide.

An anode 11 and an edge cover 12 are provided on the planarization layer 10. The anode 11 is formed of for example, a stack of a metal material such as silver or aluminum and a transparent electrode material such as ITO or IZO. The anode 11 constitutes a reflective electrode of the organic EL element 4. Further, the anode 11 is connected to the drain electrode 7d of the thin film transistor 7 through contact holes formed in the protective film 9 and the planarization layer 10.

The edge cover 12 is formed on the planarization layer 10 so as to cover pattern edges of the anode 11. The edge cover 12 also functions as an insulating layer for preventing a short circuit between the anode 11 and a cathode 14, which will be described later.

The edge cover 12 has openings, i.e., portions where the anode 11 is exposed, and these portions substantially constitute a light-emitting area of the organic EL element 4. The organic EL display device 1 of the present embodiment is configured to perform full-color display by emitting, from the RGB sub-pixels, light of the corresponding color of any of RGB. The organic EL display device 1 of the present embodiment constitutes an active matrix type display device including thin film transistors 7.

As shown in FIG. 1, an organic EL layer 13 and a cathode 14 are formed on the anode 11, and the anode 11, the organic EL layer 13, and the cathode 14 constitute the above-described organic EL element. That is, the organic EL element is, for example, a light-emitting element that is driven by a low-voltage direct current and can perform high-intensity light emission. The organic EL element includes the anode 11, the organic EL layer 13, and the cathode 14.

The cathode 14 is formed of, for example, a semi-transmissive electrode made of a simple substance or an alloy of Al, Ag, Mg, Ca or the like, or a stack of a semi-transmissive electrode made of a simple substance or an alloy of Al, Ag, Mg, Ca or the like and a transparent electrode material such as ITO or IZO. The cathode 14 constitutes a transmissive electrode or a semi-transmissive electrode of the organic EL element. For example, a sealing layer (not shown) obtained by stacking an inorganic layer made of an inorganic material and an organic layer made of an organic material is provided on the cathode 14. The sealing layer is configured to seal the organic EL element so as to prevent the degradation of the organic EL element by preventing permeation (penetration) of moisture or oxygen from the outside.

In the organic EL layer 13, for example, a hole injection layer, a hole transport layer, a light-emitting layer, an electron transport layer, an electron injection layer, and so forth are stacked from the anode 11 side (not shown). Other than the above description, a single layer may have two or more functions such as a hole injection and transport layer. Further, a carrier blocking layer or the like may be inserted into the organic EL layer 13 as appropriate.

With the configuration of the organic EL element described thus far, the organic EL display device 1 of the present embodiment is of a top-emission type that emits light from the cathode 14 side. That is, in the top-emission type organic EL display device 1, the surface of the anode 11 that is located on the cathode 14 side constitutes the effective light-emitting surface of the organic EL element 4, and emits light to the outside.

Other than the above description, a bottom-emission type organic EL display device that emits light from the base material 2 side may be formed by interchanging the placement locations of the anode 11 and the cathode 14 and reversing the order of the layers in the organic EL layer 13.

Figure 3:
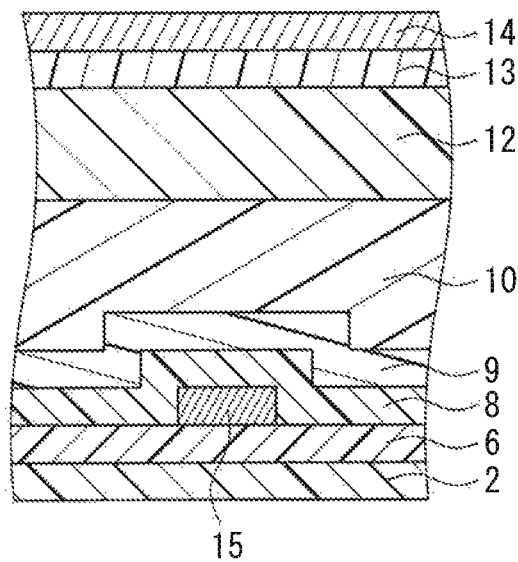
FIG. 3 is an enlarged cross-sectional view illustrating a specific example of a suppression member shown in FIG. 1.

As illustrated in FIG. 3, a suppression member 15 is formed on the inorganic film 6 in the organic EL display device 1 of the present embodiment. The suppression member 15 is a specific configuration example of the suppression members 5a to 5e of the suppression portion 5 shown in FIG. 1, and is formed, for example, of the same metal material as that of the gate electrode 7g and the gate line during the manufacturing step of the gate electrode 7g and the gate line simultaneously therewith.

Other than the above description, the suppression members 16, 17, 18, 19, and 15 and 16 shown in FIGS. 4(a), 4(b), 4(c), 4(d), and 4(e), respectively, can be used as the suppression members 5a to 5e of the suppression portion 5.

Figure 4A:
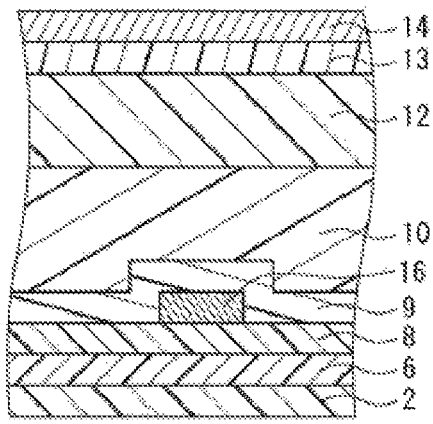
FIGS. 4(a) to 4(e) are enlarged cross-sectional views each illustrating another specific example of the suppression member shown in FIG. 1.

Specifically, in FIG. 4(a), the suppression member 16 is formed, for example, of the same metal material as that of the source electrode 7s, the drain electrode 7d, and the source line during the manufacturing step of the source electrode 7s, the drain electrode 7d, and the source line simultaneously therewith.

Figure 4D:
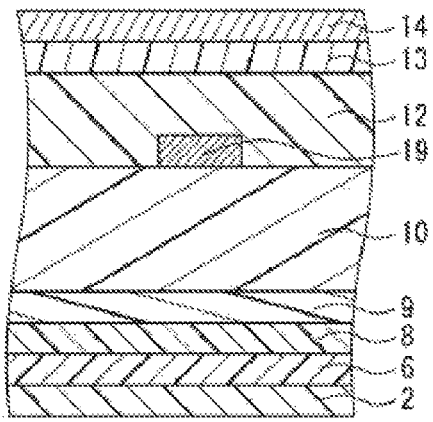
Figure 4B:
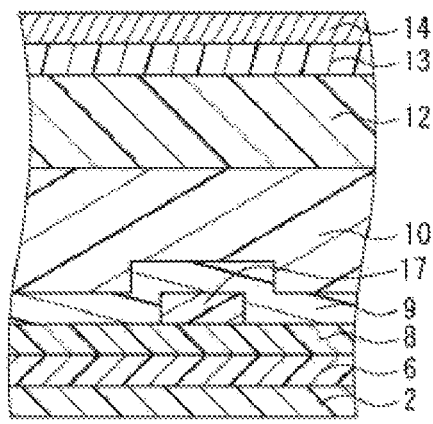

In FIG. 4(b), the suppression member 17 is formed, for example, of the same semiconductor material as that of the semiconductor layer 7h during manufacturing step of the semiconductor layer 7h simultaneously therewith.

Figure 4E:
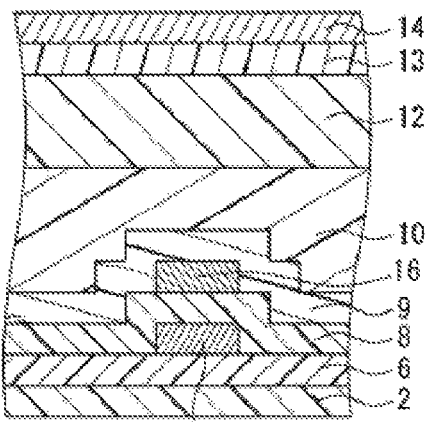
Figure 4C:
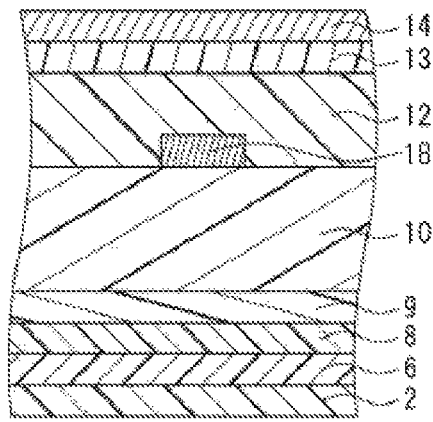

In FIG. 4(c), the suppression member 18 is formed, for example, of the same metal material as that of the gate line and the source line or a transparent electrode material such as ITO or IZO during the manufacturing step of the terminal 4a simultaneously therewith.

In FIG. 4(d), the suppression member 19 is formed, for example, of the same metal material as that of the anode 11 during the manufacturing step of the anode 11 simultaneously therewith.

As illustrated in FIG. 4(e), the suppression portion 5 may use the suppression member 15 and the suppression member 16.

Other than the above description, a plurality of suppression members 15 to 19 may be used as the suppression members 5a to 5e of the suppression portion 5.

Next, a manufacturing method of the organic EL display device 1 of the present embodiment will be described with reference to FIG. 5. Note that the following description is focused on a step of forming the display portion 3 and the terminal portion 4 on the base material 2, and subsequently completing the base material 2.

Figure 5A:
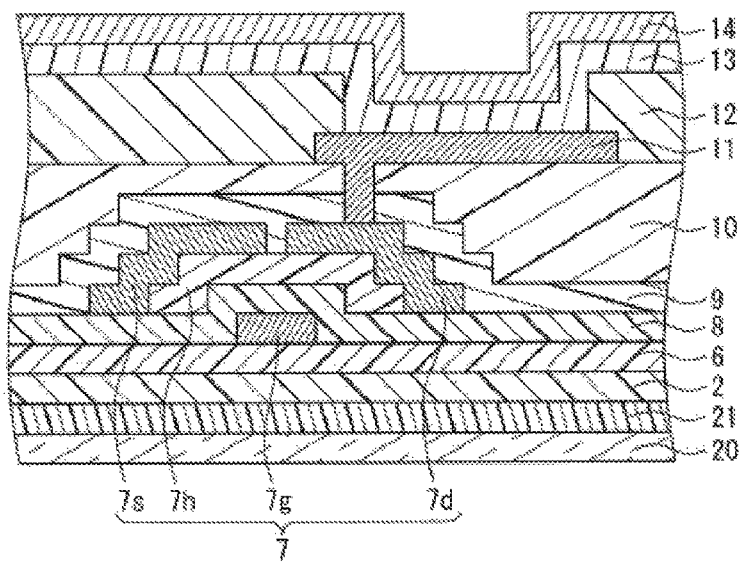
FIGS. 5(a) and 5(b) show diagrams illustrating manufacturing steps of the organic EL display device.
Figure 5B:
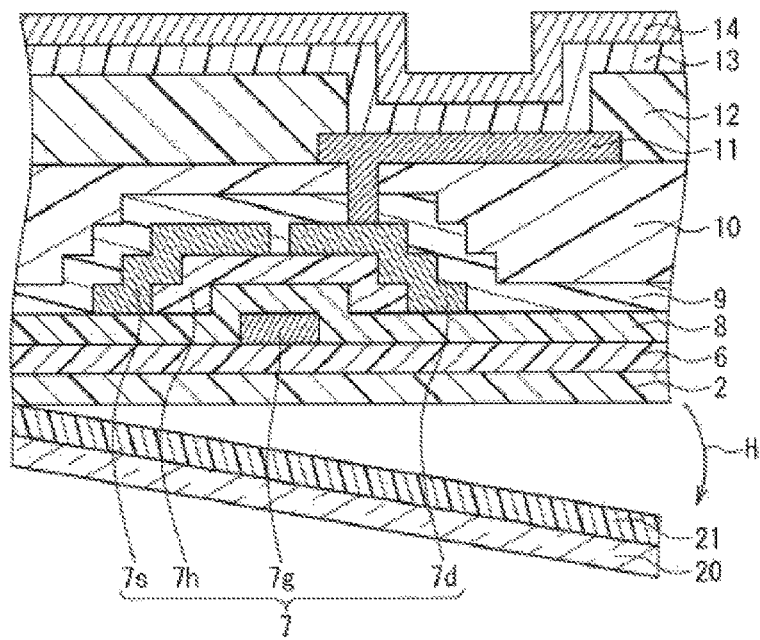

FIG. 5 shows diagrams illustrating a manufacturing step of the above-described organic EL display device, with FIGS. 5(a) and 5(b) illustrating a series of main manufacturing steps.

As shown in FIG. 5(a), for example, a release layer 21 made of a simple substance or a compound of tungsten, tantalum, molybdenum, titanium and the like, or amorphous silicon, and a glass substrate 20 are sequentially attached on the lower side of the base material 2. Then, in the organic EL display device 1 of the present embodiment, the inorganic film 6 is formed on the base material 2 in a state in which the base material 2 is stably supported by the glass substrate 20. Thereafter, the above-described display element portion including the thin film transistor 7 and the organic EL element, the terminal portion 4, and the suppression portion 5 are formed on the inorganic film 6.

Subsequently, as shown in FIG. 5(b), the base material 2, the glass substrate 20, and the release layer 21 are separated from each other. Specifically, the interface between the base material 2 and the release layer 21 is separated by applying laser light from the glass substrate 20 side as indicated by "H" in FIG. 5(b). This separation can be performed smoothly by bringing the base material 2 in a slightly bent state at the time of performing the separation. Furthermore, the organic EL display device 1 of the present embodiment is completed by performing this separation.

Other than the above description, after separation of the base material 2, a polyimide film or a film of PET, PE or the like may be attached to the base material 2 as a support via a pressure-sensitive adhesive or the like. Such attachment of a film is expected to achieve the effect of preventing the organic EL display device 1 from being easily damaged, or achieve the effect of preventing curling.

Next, effects of the suppression portion 5 will be specifically described with reference to FIG. 6.

Figure 6:
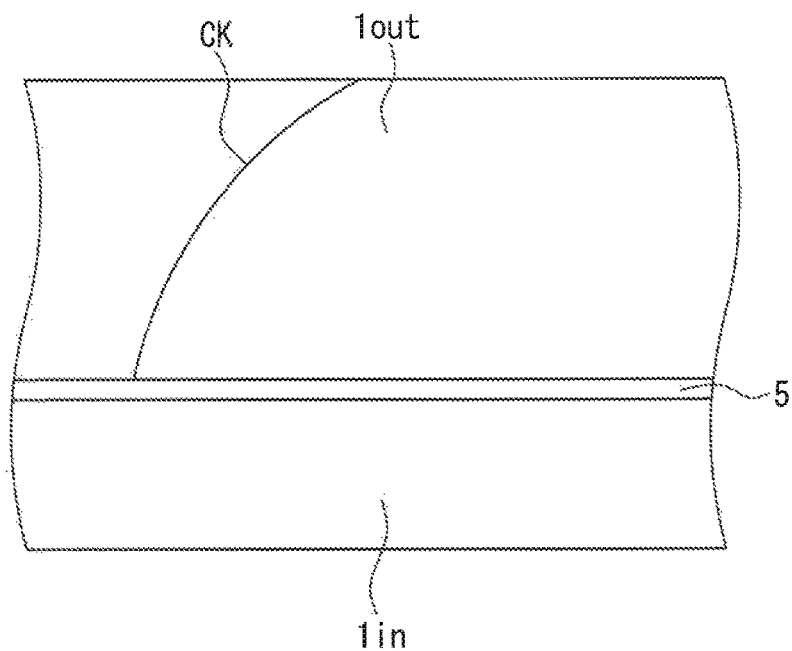
FIG. 6 is a diagram illustrating a specific effect of the suppression member shown in FIG. 1.

FIG. 6 is a diagram illustrating a specific effect of the suppression member shown in FIG. 1.

As shown in FIG. 6, when cracking CK has occurred in a peripheral portion 1out of the base material 2 as a result of bending the organic EL display device 1 during a manufacturing step or during use of the organic EL display device 1, the cracking CK progresses toward the central portion 1 in side of the base material 2 (i.e., the display portion 3 side). However, in the organic EL display device 1 of the present embodiment, the suppression portion 5 is provided outside the display portion 3. Accordingly, as shown in FIG. 6, the progression of the cracking CK is suppressed by the suppression portion 5, thus preventing the occurrence of the cracking CK inside the central portion 1 in of the base material 2. The cracking CK tends to occur starting from an inorganic material layer, or in other words, the inorganic film 6, the gate insulating film 8, and/or the protective film 9.

As a result of the verification test performed by the inventors of the present application, it was confirmed with an optical microscope that the progression of the cracking CK was successfully suppressed by the suppression portion 5 as shown in FIG. 6. Specifically, the continuity of the stress direction in the inorganic film 6 can be broken by the provision of the suppression portion 5. Accordingly, even when the cracking CK has occurred in the peripheral portion 1out of the base material 2 as a result of bending or the like of the organic EL display device 1, the progression of the cracking CK can be suppressed by the suppression portion 5.

In the organic EL display device 1 of the present embodiment configured in the above-described manner, the suppression portion 5 is provided outside the display portion 3, and suppresses the progression of cracking that has occurred in the peripheral portion of the base material 2. Consequently, unlike the conventional example, even when cracking has occurred in a peripheral portion of the base material 2, it is possible, with the organic EL display device 1 of the present embodiment, to suppress the cracking from progressing to the inside of the display portion 3. As a result, unlike the conventional example, the present embodiment makes it possible to form a highly reliable organic EL display device 1 capable of obviating adverse effects of cracking, such as the occurrence of defects or the like in the display element portion, and hence the display portion 3.

In the present embodiment, the suppression members 15, 16, 18, and 19 included in the suppression portion 5 are formed of the same material as the metal material included in the display element portion. Accordingly, the suppression members 15, 16, 18, and 19 and the metal material can be formed in the same manufacturing step, making it possible to easily manufacture a highly reliable organic EL display device 1 capable of obviating adverse effects of cracking.

In the present embodiment, the suppression member 17 included in the suppression portion 5 is formed of the same material as the semiconductor material included in the display element portion. Accordingly, the suppression member 17 and the semiconductor material can be formed in the same manufacturing step, making it possible to easily manufacture a highly reliable organic EL display device 1 capable of obviating adverse effects of cracking.

Embodiment 2

Figure 7:
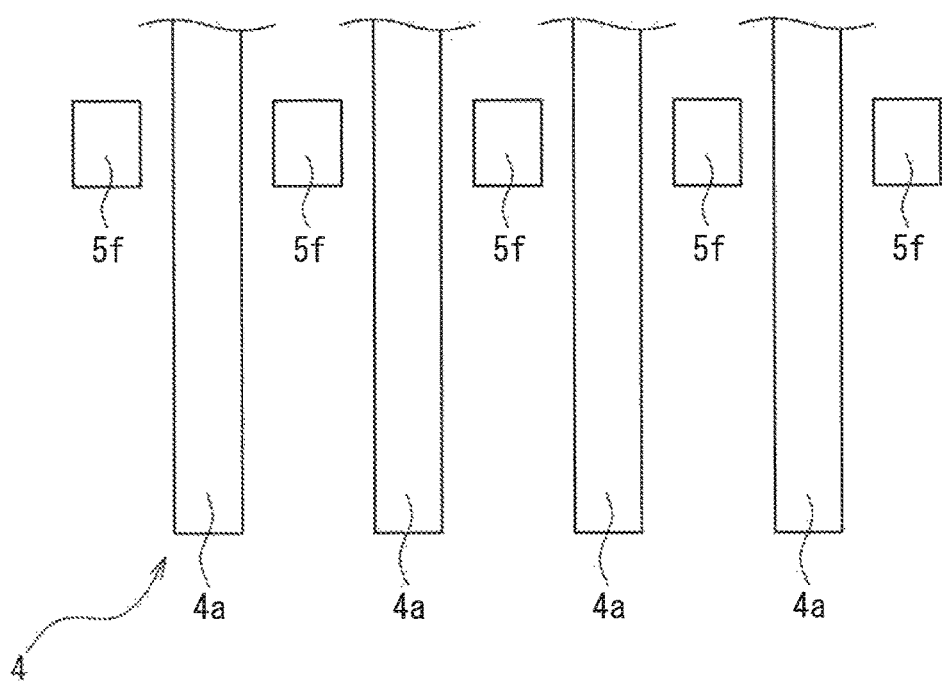
FIG. 7 is a plan view showing a configuration of a relevant portion of an organic EL display device according to Embodiment 2 of the present invention.

FIG. 7 is a plan view showing a configuration of a relevant portion of an organic EL display device according to Embodiment 2 of the present invention.

In FIG. 7, the present embodiment differs from Embodiment 1 above mainly in that the suppression members included in the suppression portion are provided inside the terminal portion. Note that the same components as those of Embodiment 1 are denoted by the same reference numerals, and the redundant description thereof has been omitted.

That is, as shown in FIG. 7, in the organic EL display device 1 of the present embodiment, the suppression members 5f included in the suppression portion 5 are provided inside the terminal portion 4. Specifically, the terminals 4a and the suppression members 5f are provided inside the terminal portion 4 such that the terminals 4a and the suppression members 5f are alternately disposed.

The suppression members 5f are formed, for example, of the same metal material as that of the gate lines and the source lines of the terminals 4a or a transparent electrode material such as ITO or IZO in the manufacturing step of the terminals 4a simultaneously therewith.

With the configuration described thus far, the present embodiment can achieve the same operation and effects as those of Embodiment 1 above.

In the present embodiment, the suppression members 5f are provided inside the terminal portion 4. Accordingly, even when cracking has occurred in a peripheral portion of the base material 2, it is possible to reliably prevent the cracking from progressing to the inside of the terminal portion 4, and hence the inside of the display portion 3.

In the present embodiment, the suppression members 5f included in the suppression portion 5 are formed of the same material as that of the terminals 4a included in the terminal portion 4. Accordingly, the suppression members 5f and the terminals 4a can be formed in the manufacturing step, making it possible to easily manufacture a highly reliable organic EL display device 1 capable of obviating adverse effects of cracking.

Other than the above description, the suppression members 5f may be formed by using a material different from that of the terminals 4a, for example, the same semiconductor material as that of the semiconductor layer 7h.

Modification of Embodiment 2

Figure 8:
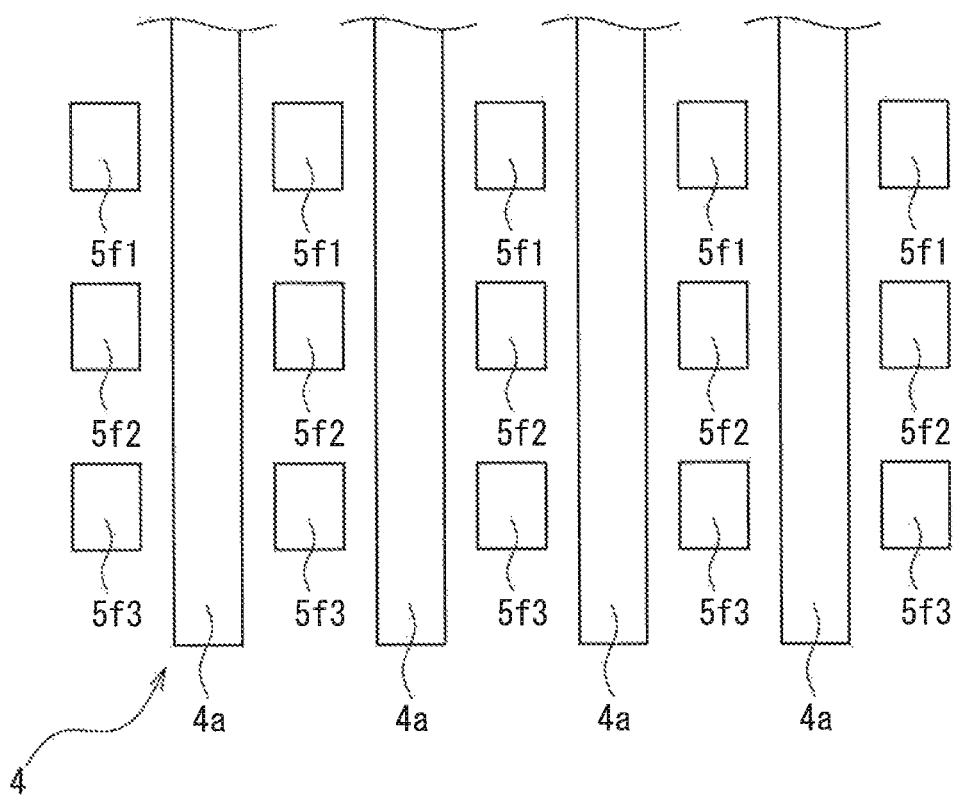
FIG. 8 is a plan view showing a configuration of a relevant portion of an organic EL display device according to a modification of the Embodiment 2 of the present invention.

FIG. 8 is a plan view of a configuration of a relevant portion of a modification of the organic EL display device according to Embodiment 2 of the present invention.

In FIG. 8, the present modification differs from Embodiment 2 above mainly in that, in the suppression portion, a plurality of suppression members are provided between two adjacent terminals so as to be parallel to the terminals.

That is, as shown in FIG. 8, in the organic EL display device 1 of the present modification, a plurality of, for example, three suppression members 5f1, 5, and 5f3 included in the suppression portion 5 are provided inside the terminal portion 4. Specifically, inside the terminal portion 4, the suppression members 5f1, 5f2, and 5f3 are sequentially disposed between two adjacent terminals 4a so as to be parallel to the terminals 4a.

The suppression members 5f1, 5f2, and 5f3 are formed, for example, of the same metal material as that of the same gate line and source lines of the terminals 4a or a transparent electrode material such as ITO or IZO during the manufacturing step of the terminals 4a simultaneously therewith.

With the configuration described thus far, the present embodiment can achieve the same operation and effects as those of Embodiment 2 above.

Other than the above description, the suppression members 5f1, 5f2, and 5f3 may be formed by using a material different from that of the terminals 4a, for example, the same semiconductor material as that of the semiconductor layer 7h.

Embodiment 3

Figure 9:
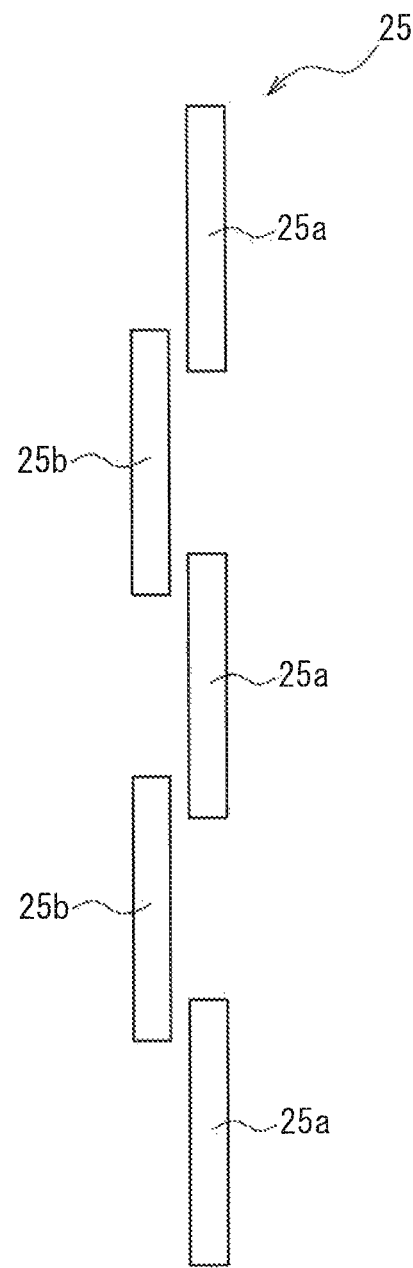
FIG. 9 is a plan view showing a configuration of a relevant portion of an organic EL display device according to Embodiment 3 of the present invention.

FIG. 9 is a plan view showing a configuration of a relevant portion of an organic EL display device according to Embodiment 3 of the present invention.

In FIG. 9, the present embodiment differs from Embodiment 1 above mainly in that, in the suppression portion, a plurality of suppression members are provided such that they are arranged along one direction and end portions thereof overlap each other in a direction orthogonal to the one direction. Note that the same components as those of Embodiment 1 are denoted by the same reference numerals, and the redundant description thereof has been omitted.

That is, as shown in FIG. 9, in the organic EL display device 1 of the present embodiment, a plurality of for example, three suppression members 25a and a plurality of for example, two suppression members 25b are provided in a suppression portion 25. The suppression members 25a and 25b are configured linearly. Further, the suppression members 25a and 25b are disposed such that they are arranged alternately in an up-down direction in (one direction) in FIG. 9, and end portions thereof overlap each other in a direction orthogonal to the up-down direction.

With the configuration described thus far, the present embodiment can achieve the same operation and effects as those of Embodiment 1 above.

In the present embodiment, a plurality of suppression members 25a and 25b arranged in one direction are included in the suppression portion 25, and end portions of the plurality of suppression members 25a and 25b are provided so as to overlap each other in a direction orthogonal to the one direction. Consequently, in the present embodiment, the effect of suppressing the progression of cracking by the suppression portion 25 can be easily enhanced, making it possible to reliably obviate adverse effects of cracking.

Further, each of the suppression members 25a and 25b of the present embodiment is formed to be shorter than the suppression member of Embodiment 1. Accordingly, it is possible to prevent formation of an unnecessary parasitic capacitance in the organic EL display device 1.

Modifications of Embodiment 3

Figure 10A:
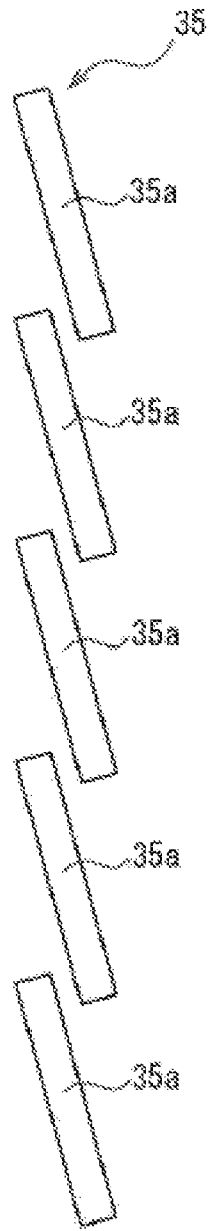
FIGS. 10(a) and 10(b) are plan views each showing a modification of a suppression member as shown in FIG. 9.
Figure 10B:
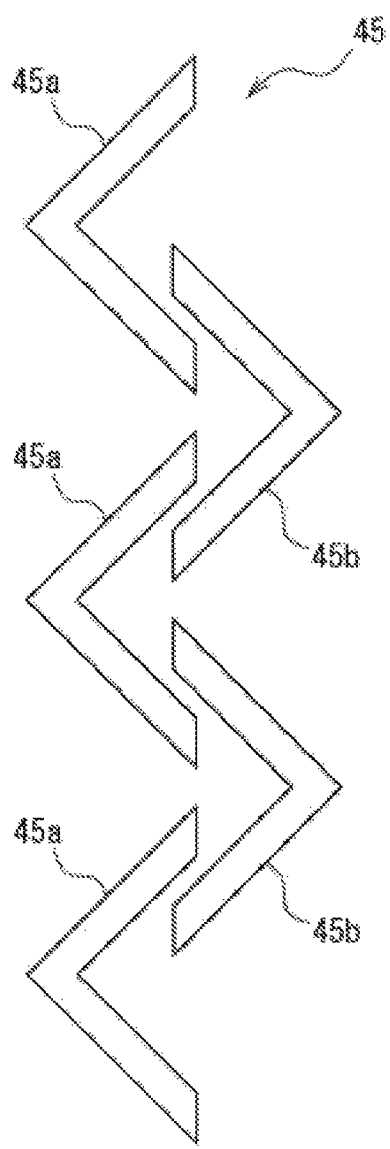

FIGS. 10(a) and 10(b) are plan views each showing a modification of the suppression members shown in FIG. 9.

In FIGS. 10(a) and 10(b), the present modifications differ from Embodiment 3 above mainly in that the shape of each of the plurality of suppression members of the suppression portion is changed.

That is, as shown in FIG. 10(a), in the organic EL display device 1 of the present modification, a plurality of for example, five suppression members 35a are provided in a suppression portion 35. The suppression members 35a are configured linearly. Further, the suppression members 35a are disposed such that they are arranged at a predetermined angle along an up-down direction (one direction) in FIG. 10(a), and end portions thereof overlap each other in a direction orthogonal to the up-down direction.

As shown in FIG. 10(b), in an organic EL display device 1 of another modification, a plurality of, for example, three suppression members 45a and a plurality of for example, two suppression members 45b are provided in a suppression portion 45. The suppression members 45a and 45b are configured in a shape having a bent portion. Further, the suppression members 45a and 45b are disposed such that they are arranged alternately in an up-down direction (one direction) in FIG. 10(b), and end portions thereof overlap each other in a direction orthogonal to the up-down direction.

With the configuration described thus far, the present embodiment can achieve the same operation and effects as those of Embodiment 3 above.

Embodiment 4

Figure 11:
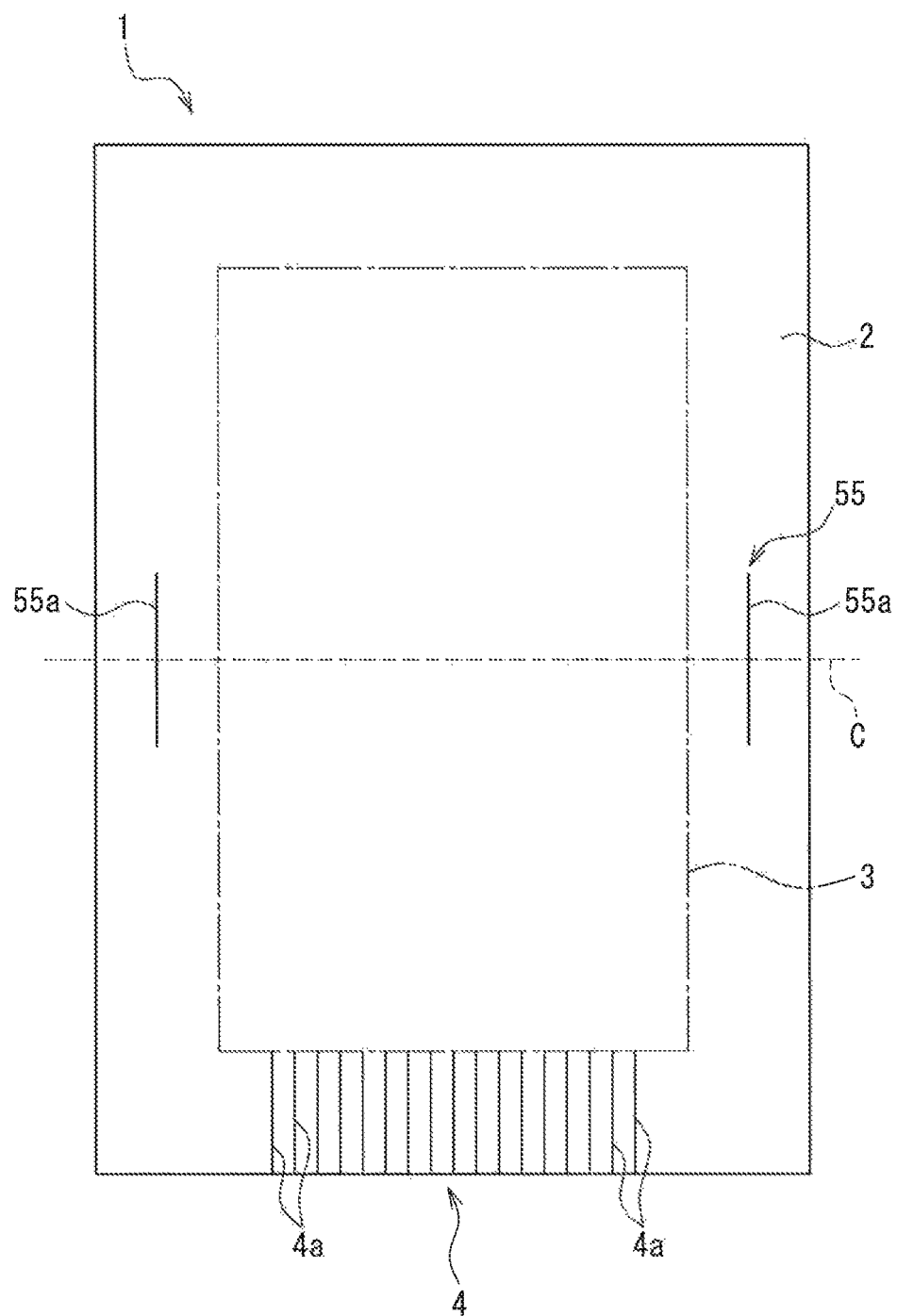
FIG. 11 is a plan view showing a configuration of a relevant portion of an organic EL display device according to Embodiment 4 of the present invention.
Figure 12:
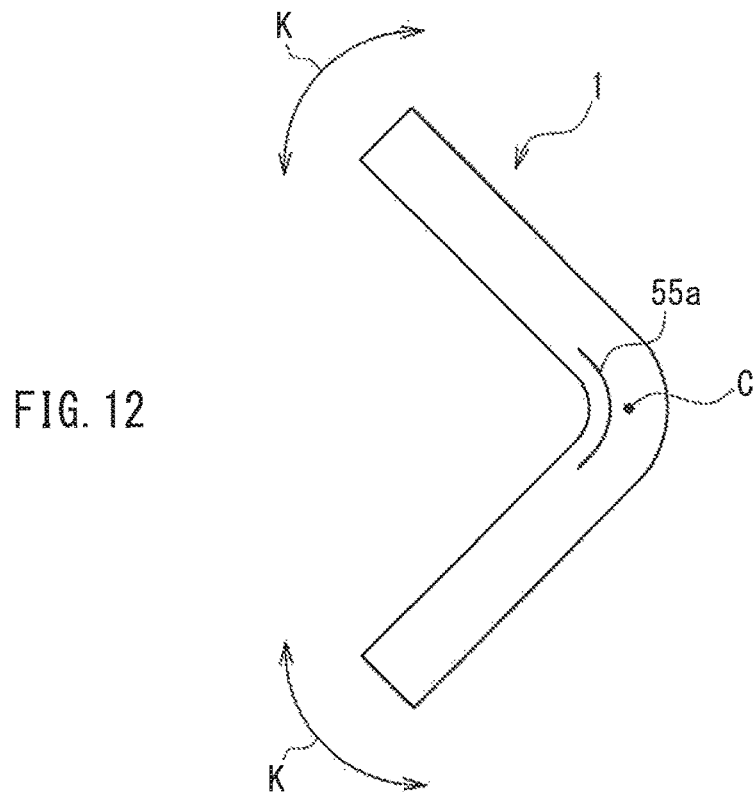
FIG. 12 is a cross-sectional view illustrating an operation of a suppression member shown in FIG. 11.

FIG. 11 is a plan view showing a configuration of a relevant portion of an organic EL display device according to Embodiment 4 of the present invention. FIG. 12 is a cross-sectional view illustrating an operation of a suppression member shown in FIG. 11.

In FIGS. 11 and 12, the present embodiment differs from Embodiment 1 above mainly in that, in the suppression portion, the suppression members are provided at a center of bending of the base material. Note that the same components as those of Embodiment 1 above are denoted by the same reference numerals, and the redundant description thereof has been omitted.

That is, as shown in FIG. 11, in the organic EL display device 1 of the present embodiment, suppression members 55a are disposed at a center of bending C of the base material 2 (i.e., a center of bending of the organic EL display device 1) in a suppression portion 55. Further, except for the vicinity of the center of bending C, the base material 2 is formed of a material having a relatively high rigidity.

As described above, the suppression members 55a are disposed at the center of bending C of the base material 2. Accordingly, the suppression members 55a are disposed at a location where cracking tends to occur when the organic EL display device 1 is bent as indicated by "K" in FIG. 12.

With the configuration described thus far, the present embodiment can achieve the same operation and effects as those of Embodiment 1 above.

In the present embodiment, the suppression members 55a included in the suppression portion 55 are disposed at the center of bending C of the base material 2. Consequently, in the present embodiment, the suppression members 55a are placed at a location where cracking tends to occur. Accordingly, the progression of cracking can be more effectively suppressed, making it possible to more reliably obviate adverse effects of cracking.

Further, the suppression members 55a of the present embodiment are configured to be shorter than the suppression member of Embodiment 1. Accordingly, it is possible to prevent formation of an unnecessary parasitic capacitance in the organic EL display device 1.

Embodiment 5

Figure 13:
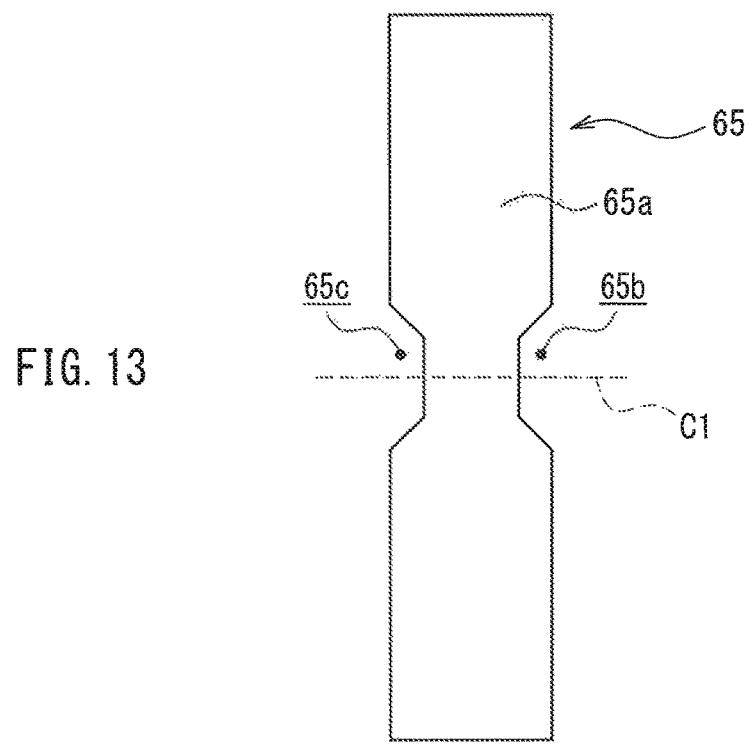
FIG. 13 is a plan view showing a configuration of a relevant portion of an organic EL display device according to Embodiment 5 of the present invention.

FIG. 13 is a plan view showing a configuration of a relevant portion of an organic EL display device according to Embodiment 5 of the present invention.

In FIG. 13, the present embodiment differs from Embodiment 1 above mainly in that cut-out portions are provided in the suppression member at positions corresponding to a center of bending of the base material. Note that the same components as those of Embodiment 1 above are denoted by the same reference numerals, and the redundant description thereof has been omitted.

That is, as shown in FIG. 13, in the organic EL display device 1 of the present embodiment, cut-out portions 65b and 65c are provided in a suppression member 65a of a suppression portion 65 at positions corresponding to a center of bending C1 of the base material 2.

With the configuration described thus far, the present embodiment can achieve the same operation and effects as those of Embodiment 1 above.

In the present embodiment, the cut-out portions 65b and 65c are provided in the suppression member 65a at positions corresponding to the center of bending C1 of the base material 2. Accordingly, even when the base material 2 is bent, a damage to the suppression member 65a can be suppressed by the cut-out portions, making it possible to easily inhibit the occurrence of a damage or the like to the suppression member 65a.

Embodiment 6

FIGS. 14(a) and 14(b) are a plan view and a cross-sectional view, respectively, showing a configuration of a relevant portion of an organic EL display device according to Embodiment 6 of the present invention.

Figure 14:
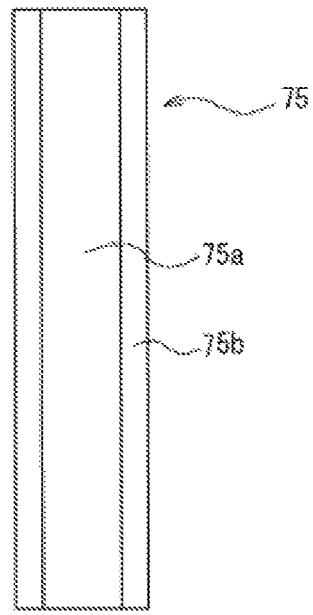
FIGS. 14(a) and 14(b) are a plan view and a cross-sectional view, respectively, showing a configuration of a relevant portion of an organic EL display device according to Embodiment 6 of the present invention.
Figure 14:
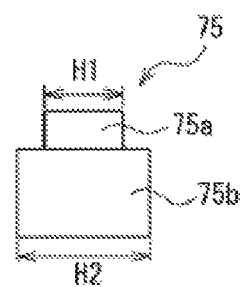

In FIG. 14, the present embodiment differs from Embodiment 1 above mainly in that two suppression members that are stacked on each other are used in the suppression portion. Note that the same components as those of Embodiment 1 above are denoted by the same reference numerals, and the redundant description thereof has been omitted.

That is, as shown in FIGS. 14(a) and 14(b), in the organic EL display device 1 of the present embodiment, a plurality of, for example, two suppression members 75a and 75b are stacked on each other in a suppression portion 75. Further, in the suppression members 75a and 75b, width dimensions respectively indicated by "H1" and "H2" in FIG. 14(b) are set to be a value in the range from 2 to 50 μm and a value in the range from 2 to 50 μm, for example.

Further, in the suppression portion 75, the suppression member 75a is disposed on the bending side of the base material 2, and the suppression member 75b is disposed on a side opposite to the bending side of the base material 2.

Specifically, in the suppression portion 75, the suppression member 75b is formed by using the same metal material as that of the source lines, and the suppression member 75a is formed by using the same semiconductor material as that of the semiconductor layer 7h.

Other than the above description, the suppression member 75b may be formed by using the same metal material as the gate lines, and the suppression member 75a may be formed by using the same metal material as the source lines. Also, the gate insulating film 8 and the semiconductor layer 7h between the suppression members 75b and the suppression member 75a may be formed so as to be open.

With the configuration described thus far, the present embodiment can achieve the same operation and effects as those of Embodiment 1 above.

In the present embodiment, the two suppression members 75a and 75b that are stacked on each other are used in the suppression portion 75. Accordingly, the strength of the suppression members 75a and 75b can be increased, making it possible to reliably inhibit the occurrence of a damage or the like to the suppression members 75a and 75b.

In the present embodiment, of the plurality of suppression members 75a and 75b, the suppression member 75a located on the bending side of the base material 2 preferably has a width dimension having a value smaller than that of the suppression member 75b located on a side opposite to the bending side of the base material 2. With this configuration, the strength of the suppression members 75a and 75b against bending of the base material 2 can be increased in the present embodiment, making it possible to reliably inhibit the occurrence of a damage or the like to the suppression members 75a and 75b.

The above embodiments are shown merely for an illustrative purpose and are not limiting. The technical scope of the present invention is defined by the appended claims, and all changes that come within the range of equivalency of the claims are intended to be embraced therein.

For example, in the foregoing description, the present invention is applied to the organic EL display device. However, the present invention is not limited in any way as long as the display device includes a flexible substrate in which a display portion is provided, an inorganic film provided on the substrate, a display element portion that is provided on the inorganic film and is provided to form the display portion, and a suppression portion that is provided outside the display portion and suppresses progression of cracking that has occurred in a peripheral portion of the substrate. Specifically, the present invention is applicable to an inorganic EL display device that uses an inorganic EL element including an inorganic compound, for example. The present invention is also applicable to a liquid crystal display device including a liquid crystal layer.

In the above description, the present invention is applied to an active matrix type organic EL display device including thin film transistors (TFTs) 7. However, the present invention is not limited thereto, and is also applicable to a passive matrix type organic EL display device including no thin film transistor.

Other than the above description, the present invention is also applicable to an organic EL display device including an opposing substrate that is formed of a flexible material and is provided so as to oppose the base material 2.

In the above description, the suppression member of the suppression portion is provided on the upper side (the side opposite to the base material) of the inorganic film. However, the present invention is not limited thereto, and the suppression member of the suppression portion may be provided on the lower side (i.e., between the inorganic film and the base material) of the inorganic film.

Other than the above description, Embodiments 1 to 6 above may be combined as appropriate.

INDUSTRIAL APPLICABILITY

The present invention is useful for a highly reliable display device capable of obviating adverse effects of cracking.

LIST OF REFERENCE NUMERALS

1 Organic EL display device (display device)
2 Base material (substrate)
3 Display portion
4 Terminal portion
4a Terminal
5, 25, 35, 45, 55, 65, 75 Suppression portion
5a, 5b, 5c, 5d, 5e, 5f, 5f1, 5f2, 5f3, 15, 16, 17, 18, 19, 25a, 35a, 45a, 55a, 65a, 75a, 75b Suppression member
7 Thin film transistor (display element portion)
7s Source electrode (display element portion)
7g Gate electrode (display element portion)
7d Drain electrode (display element portion)
7h Semiconductor layer (display element portion)
11 Anode (display element portion)
13 Organic EL layer (display element portion)
14 Cathode (display element portion)

The invention claimed is:
1. A display device including a display portion, the display device comprising:
   a flexible substrate;
   a first inorganic film provided over the substrate;

a display element provided on the first inorganic film and defining the display portion;

a terminal portion provided outside the display portion and connecting the display element to a signal line from outside; and a first projection provided on the first inorganic film outside the display portion and surrounding the display portion except for at least a portion of a side of the display portion that faces the terminal portion.

2. The display device according to claim 1, wherein the display portion is substantially rectangular, and the first projection is provided parallel to three sides of the display portion except for a side of the display portion where the terminal portion is defined.

3. The display device according to claim 1, wherein the first projection does not intersect an outer end portion of the display device.

4. The display device according to claim 1, wherein the first projection is defined to be continuous.

5. The display device according to claim 1, wherein the first projection is arranged in a plurality of rows along one direction in a region outside the display portion, and an end portion of the first projection arranged on an inner side among the plurality of rows and an end portion of the first projection arranged on an outer side among the plurality of rows overlap each other in a direction vertical to the one direction.

6. The display device according to claim 1, wherein the first projection is covered with a second inorganic film.

7. The display device according to claim 1, wherein the first inorganic film is silicon nitride, silicon oxide, or silicon oxynitride.

8. The display device according to claim 1, wherein the first projection is covered with an organic silicon, or an organic material, the organic silicon includes polysiloxane or silicon carbide oxide, and the organic material includes acrylate, polyurea, parylene, polyimide, or polyamide.

9. The display device according to claim 1, wherein a second projection overlaps the first projection in a plain view.

10. The display device according to claim 9, wherein the second projection is narrower than the first projection.

11. The display device according to claim 9, wherein a second inorganic film is defined between the first projection and the second projection to cover the first projection.

12. The display device according to claim 9, wherein at least one of the first projection and the second projection includes a first metal material.

13. The display device according to claim 12, wherein the other one of the first projection and the second projection includes a second metal material which is define by a different process that defines the first metal material.

14. The display device according to claim 12, wherein the other one of the first projection and the second projection includes a semiconductor material.

15. The display device according to claim 12, wherein the first metal material includes one of a molybdenum film, an aluminum film, a titanium film, a tungsten film, a tantalum film, a silver film, a copper film, an alloy film thereof, and a transparent electrode material.

16. The display device according to claim 12, wherein the other one of the first projection and the second projection includes a same material as that of an anode in the display element.

17. A display device including a display portion, the display device comprising:

a flexible substrate;

a first inorganic film provided over the substrate;

a display element provided on the first inorganic film and defining the display portion;

a terminal portion provided outside the display portion and connecting the display element to a signal line from outside; and a projection provided on the first inorganic film outside the display portion, the projection intersecting a bending portion of the display device.

18. The display device according to claim 17, wherein the projection includes a cut-out portion at a position corresponding to the bending portion.

19. The display device according to claim 17, wherein the projection includes a metal material.

20. The display device according to claim 17, wherein the projection includes a semiconductor material.

* * * * *